United States Patent [19]

Akashi

[11] Patent Number: 5,896,326
[45] Date of Patent: Apr. 20, 1999

[54] SEMICONDUCTOR MEMORY AND A COLUMN REDUNDANCY DISCRIMINATION CIRCUIT APPLIED THEREIN

[75] Inventor: Shunichi Akashi, Tokyo, Japan

[73] Assignee: NEC Corporation, Tokyo, Japan

[21] Appl. No.: 08/890,943

[22] Filed: Jul. 10, 1997

[30] Foreign Application Priority Data

Jul. 10, 1996 [JP] Japan .................................. 8-180792

[51] Int. Cl.$^6$ ...................................... G11C 7/00
[52] U.S. Cl. .................. 365/200; 365/225.7; 365/230.03
[58] Field of Search ........................ 365/200, 225.7, 365/230.03

[56] References Cited

U.S. PATENT DOCUMENTS

| | | | |
|---|---|---|---|
| 5,359,560 | 10/1994 | Suh et al. | 365/200 |
| 5,590,085 | 12/1996 | Yuh et al. | 365/225.7 |
| 5,742,547 | 4/1998 | Lee | 365/225.7 |
| 5,768,198 | 6/1998 | Moroo | 365/200 |

FOREIGN PATENT DOCUMENTS

| | | |
|---|---|---|
| 3-198289 | 8/1991 | Japan . |
| 3-198290 | 8/1991 | Japan . |
| 2135485 | 8/1984 | United Kingdom . |

*Primary Examiner*—Son T. Dinh
*Attorney, Agent, or Firm*—Sughrue, Mion, Zinn, Macpeak & Seas, PLLC

[57] ABSTRACT

To minimize the number of fuses for the block write redundancy discrimination, a semiconductor memory of the invention having a block write function of eight columns comprises; a first and a second memory cell array (MCA1 and MCA2) both driven by a common row decoder (RD1), logic of LSB (Y0) of the column address of the first memory cell array being '0' and that of the second memory cell array being '1', a first and a second column decoders (CD1 and CD2), and a first and a second column redundancy discrimination circuits (CRD1 and CRD2), each controlling corresponding each of the first and the second column decoders to replace data write into a defective column address by data write to a redundant column address, by watching logic of higher bits (Y3 to Y7) and corresponding half of eight column mask signals (CM0 to CM7) in a block write mode.

3 Claims, 4 Drawing Sheets

SEMICONDUCTOR MEMORY AND A COLUMN REDUNDANCY DISCRIMINATION CIRCUIT APPLIED THEREIN

BACKGROUND OF THE INVENTION

The present invention relates to a semiconductor memory, and more particularly, to a semiconductor memory having a block write function whereby data can be written into a plurality of column addresses thereof simultaneously and selectively.

In an ordinary semiconductor memory, data are written by one access at one particular column address designated by column address data supplied. Another type of semiconductor memory has a so called block write function, whereby data can be written into a plurality of column addresses, selected according to the higher bit sequence of the column address data by ignoring a certain number of lower bits of the column address data corresponding to the number of columns to be written simultaneously. For example, in an eight column block, write operation, that is, when data are to be written in eight succeeding columns simultaneously, the lower three bits of the column address data are ignored.

In semiconductor memories having the block write function, a column mask function is generally also provided, whereby permission or prohibition of data write is controlled for each of the selected columns according to column mask signals. In this block write mode, the column mask signals take charge of individual column selection among the selected sequence of columns, in place of the ignored lower bits of the column address data.

There are also semiconductor memories that use a column redundancy address for each of their memory cell arrays. When column address data designate a defective digit line, where any defective memory cell is found in the production process, it is discriminated by a redundancy discrimination circuit and the defective column address is replaced by the column redundancy address, in a normal write mode or read-out mode.

However, in the block write mode, a redundancy discrimination circuit must also discriminate whether the defective digit line is designated or not, according to the column mask signals as well as the higher bit sequence of the column address data.

Generally, a redundancy discrimination circuit comprises a certain number of fuses together with a logic circuit. The fuses, which are to be cut by a laser beam, need comparatively wide spaces of the memory chip. Therefore, a decrease of the number in fuses for a column redundancy discrimination circuit, provided for each memory cell array, is important for reducing the chip size of a semiconductor memory.

FIG. 3 is a circuit diagram illustrating an example of a column redundancy discrimination circuit in a prior art a semiconductor memory, wherein an eight column block write is performed. The array configuration of this semiconductor memory is illustrated in FIG. 4.

First, the configuration of the column redundancy discrimination circuit shown in FIG. 3 will be described.

The column redundancy discrimination circuit of FIG. 3 has a normal redundancy discrimination circuit and a block write redundancy discrimination circuit.

The normal redundancy discrimination circuit comprises:
seven pairs of fuses H0T, H0N to H6T, H6N, where an end of each fuse is connected to a node A for outputting a column redundancy discrimination signal RD;

seven pairs of transfer gates Tr0T, Tr0N to Tr6T, Tr6N, each thereof connected between ground and the other end of a corresponding fuse of the seven pairs of fuses H0T, H0N to H6T, H6N; and a transfer gate Tr21, controlled by a pre-charge signal PR and provided between a power supply and the node A.

The block write redundancy discrimination circuit comprises:
eight fuses H30 to H37, an end of each thereof connected to a node B, eight transfer gates Tr30 to Tr37, each thereof connected between ground and the other end of each of the eight corresponding fuses H30 to H37, a transfer gate Tr23, controlled by a pre-charge signal PR and provided between a power supply and the node B, a NOR gate N1 for outputting NOR logic of a block write control signal BW and logic of the node B, and a transfer gate Tr22 connected between the node A and ground and controlled by the output of the NOR gate N1.

Before the column redundancy discrimination, the node A and the node B are pre-charged at logic HIGH through the transfer gates Tr21 and Tr23 controlled by the pre-charge signal PR.

Operation of the column redundancy discrimination circuit of FIG. 3 will now be described.

When a defective column address is found in the memory cell array, either one of each of the seven pairs of fuses H0T, H0N to H6T, H6N is cut, according to the defective column address. When the defective column address is '1111000' in binary code, for example, fuses H0N, H1N and H2N corresponding to logic '0' of the lower three bits, and H3T, H4T, H5T and H6T, corresponding to logic '1' of the higher four bits of the defective column address, are cut.

In the normal write mode, the gates of each pair of the seven pairs of transfer gates Tr0T, Tr0N to Tr6T, Tr6N is supplied with one of the corresponding seven pairs of complementary column address signals Y0T, Y0N to Y6T, Y6N, each pair thereof representing the logic and inverted logic of each of the corresponding lower seven bits of the column address data.

Therefore, when logic the lower seven bits of the column address data is '1111000', that is, when the logic of the complementary column address signals Y0N, Y1N, Y2N, Y3T, Y4T, Y5T and Y6T is HIGH and logic of the other complementary column address signals is LOW, corresponding the transfer gates Tr0N, Tr1N, Tr2N, Tr3T, Tr4T, Tr5T and Tr6T are in an ON state. However, where every corresponding fuse is cut, the node A remains at logic HIGH, which allows the replacement by the column redundancy address. On the contrary, when the logic of the lower seven bits of the column address is not '1111000', at least one of the transfer gates Tr0T, Tr1T, Tr2T, Tr3N, Tr4N, Tr5N and Tr6N turns ON and the node A is grounded through at least one of the uncut fuses. When grounded, the node A outputs the redundancy discrimination signal RD at logic LOW, disabling the replacement by the column redundancy address.

On the other hand, for the column redundancy discrimination in the block write mode, one of the eight fuses H30 to H37, that corresponds to the defective digit line is left uncut, the others of the eight fuses H30 to H37 being cut. In the case where the defective column address is '1111000', the first fuse H30, corresponding to logic '000' of the lower three bits of the defective column address, is left uncut.

In the block write mode, the complementary column address signals Y0T, Y0N to Y2T, Y2N, corresponding to the lower three bits of the column address data are suppressed, and in place thereof, each of eight column mask signals CM0 to CM7, logic HIGH thereof prohibiting a data-write to a corresponding digit line, is supplied to the gate of each of the eight corresponding transfer gates Tr30 to Tr37 of the block write redundancy discrimination circuit.

Therefore, when a logic LOW is supplied to the first transfer gate Tr30 connected to the first fuse H30 corresponding to the defective digit line, that is, when the column address corresponding to the defective digit line is not masked, the logic of the node B remains at a logic HIGH making the output of the NOR gate N1 a logic LOW, which maintains the transfer gate Tr22, in an OFF state. So, the logic of the node A is determined according to the logic of the higher four pairs of the complementary column address signals Y3T, Y3N to Y6T, Y6N, indicating a column block where the block write is to be performed and the column redundancy replacement is performed when the higher bits of the column address data coincide with those of the defective column address.

By comparison, when logic HIGH is supplied to the transfer gate Tr30 corresponding to the uncut fuse H30, that is, when block write to the defective digit line is masked, the node B is grounded, turning the transfer gate Tr22 ON, thereby prohibiting data write into the column redundancy address, so that the data previously written there are not revised.

Now configuration of memory cell arrays will be described referring to an example illustrated in FIG. 4.

In many semiconductor memories, row decoders are arranged so that they are divided over two or more memory cell arrays in order to reduce load for a particular word. In the example of FIG. 4, memory cells are divided into four memory cell arrays MCA41 to MCA44, according to the MSB (Most Significant Bit) of both the row address data and the column address data. Representing the logic of the MSB of the row address data by X8 and that of the column address data by Y7, a first row decoder RD1 is selected when X8=0, and a second row decoder RD2 is selected when X8=1. When Y7=0, a first and a third column decoders CD41 and CD43 are selected, while a second and a fourth decoders CD42 and CD44 are selected when Y7=1.

The same word lines of the memory cell arrays MCA41 and MCA42 or MCA43 and MCA44 are selected by the first row decoder RD1, or by the second row decoder RD2, according to the logic of the lower bits (X0 to X7) of the row address data and. The same digit lines of the memory cell arrays MCA41 and MCA43 or MCA42 and MCA44 are selected by the first and the third column decoders CD41 and CD43 or the second and the fourth column decoders CD42 and CD44, respectively, according to logic of the lower bits (Y0 to Y6) of the column address data.

In the normal write mode, two word lines WA of the memory cell arrays MCA41 and MCA42, or two other word lines WB of the memory cell arrays MCA43 and MCA44, are selected according to the row address data, as in the example of FIG. 4, and the memory cell arrays not having selected word lines are disabled. A digit line is then selected from digit lines in the two enabled memory cell arrays, specifying a designated memory cell.

Therefore, a column redundancy discrimination circuit (CRD41 to CRD44) must be provided for each of the memory cell arrays MCA41 to MCA44 thus arranged, for discriminating column address data designating each defective digit line.

Further, in the semiconductor memory having the block write function for as certain number of columns, each column redundancy discrimination circuit of the prior art must be provided with the same number of fuses as the number of columns to be selected simultaneously for the block write redundancy discrimination.

As previously described, miniaturization of fuses is difficult compared to other components of the semiconductor memory because they should be prepared to be cut separately by a laser beam after production of the semiconductor memory. Therefore, as the number of columns to be written with one block write and the number of memory cell arrays, increase, where memory cells of the same row address are divided, this results in a wider chip size of the semiconductor memory.

This is a problem presented by the prior art.

SUMMARY OF THE INVENTION

Therefore, a primary object of the present invention is to provide a semiconductor memory and a column redundancy discrimination circuit applied therein, where the number of fuses for the block write redundancy discrimination is minimized.

In order to achieve the object, a semiconductor memory according to an embodiment of the invention having a block write function of eight columns comprises:

a first and a second memory cell arrays both driven by a common row decoder, where the LSB (Least Significant Bit) of the column address data corresponding to each of the memory cells of the first memory cell array is '0' and that of the second memory cell array '1', a first and a second column decoders, wherein either the first or the second column decoders selects a memory cell corresponding to the column address data by decoding variable bits of the column address data other than the LSB in a normal write mode, and where each of the first and the second column decoders selects memory cells according to a logic that uses bits higher than the lower three bits of the column address data, according to half of eight column mask signals corresponding to logic of the second and a third lower bits, in a block write mode; and a first and a second column redundancy discrimination circuit, each controlling, respectively, the first and the second column decoders as the decoders replace a data write operation into a memory cell connected to a defective digit line by a data write operation into a corresponding memory cell connected to a redundant digit line, where the controlling includes watching logic of the variable bits in the normal write mode, and watching logic of the higher bits and the corresponding half of the eight column mask signals in the block write mode.

In this embodiment, the numbers of fuses for the block write redundancy discrimination can be reduced to an amount equal to half the number of columns to be written simultaneously in one block write, for each of the column redundancy discrimination circuits of the embodiment, enabling to a reduction of the chip size of the semiconductor memory.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Embodiments of the present invention will now be described in connection with the drawings.

Figure 1:
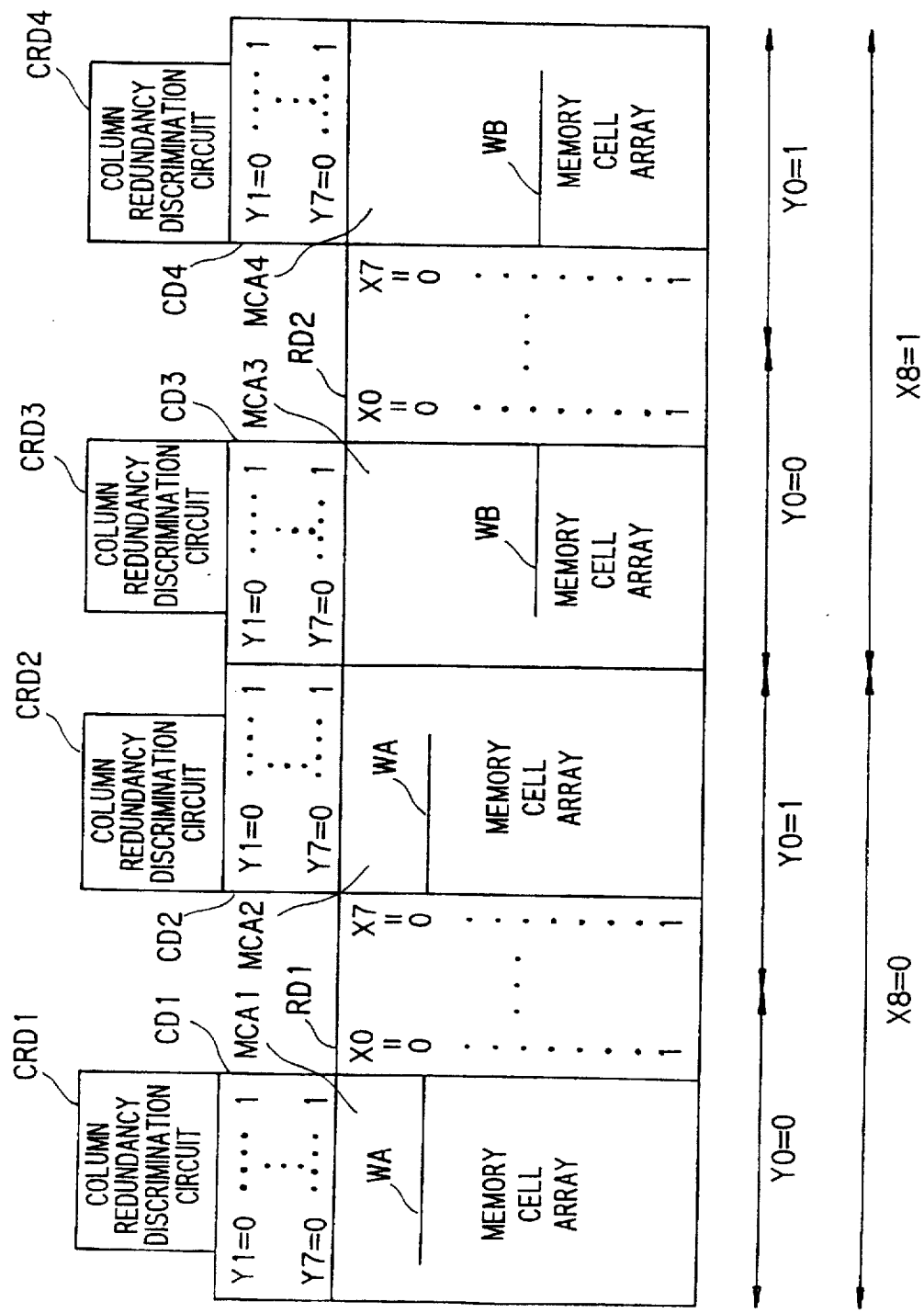
FIG. 1 illustrates an array configuration of a semiconductor memory according to an embodiment of the invention.

FIG. 1 illustrates an array configuration of a semiconductor memory according to an embodiment of the invention. The semiconductor memory has a block write function of eight columns, where memory cells therein are divided into four memory cell arrays MCA1 to MCA4, each provided with, respectively, a column decoder CD1 to CD4 and a column redundancy discrimination circuit CRD1 to CRD4, as included in the conventional semiconductor memory of FIG. 4.

Figure 4:
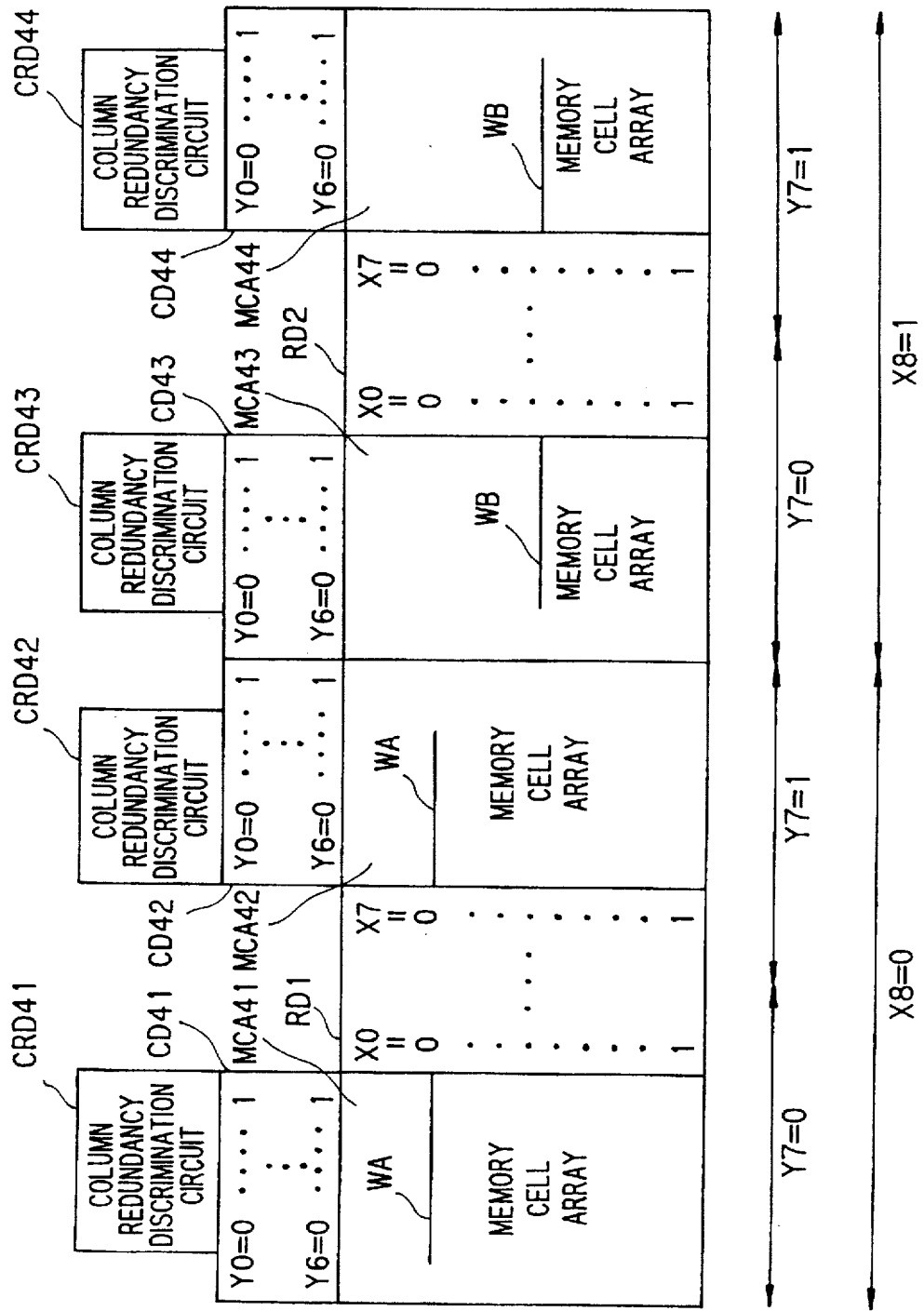
FIG. 4 illustrates an example of an array configuration of the semiconductor memory of the prior art.

The memory cell arrays MCA1 and ACA2 are driven by a first row decoder RD1 when the logic of the MSB X8 of row address data is '0', and the memory cell arrays MCA3 and MCA4 are driven by a second row decoder RD2 when the logic of MSB X8 of the row address data is '1', in the same way as the semiconductor memory of FIG. 4.

However, in the embodiment of FIG. 1, one of the selected two memory cell arrays MCA1 and MCA2 or MCA3 and MCA4 is selected according to the LSB (Least Significant Bit) Y0 of the column address data, in the normal write mode or the read-out mode. Each of the column decoders CD1 to CD4 then decodes the other higher bits (Y1 to Y7) of the column address data. As a result, four columns are selected from each of the selected two memory cell arrays MCA1 and MCA2 or MCA3 and MCA4, in the block write mode of eight columns.

Figure 2:
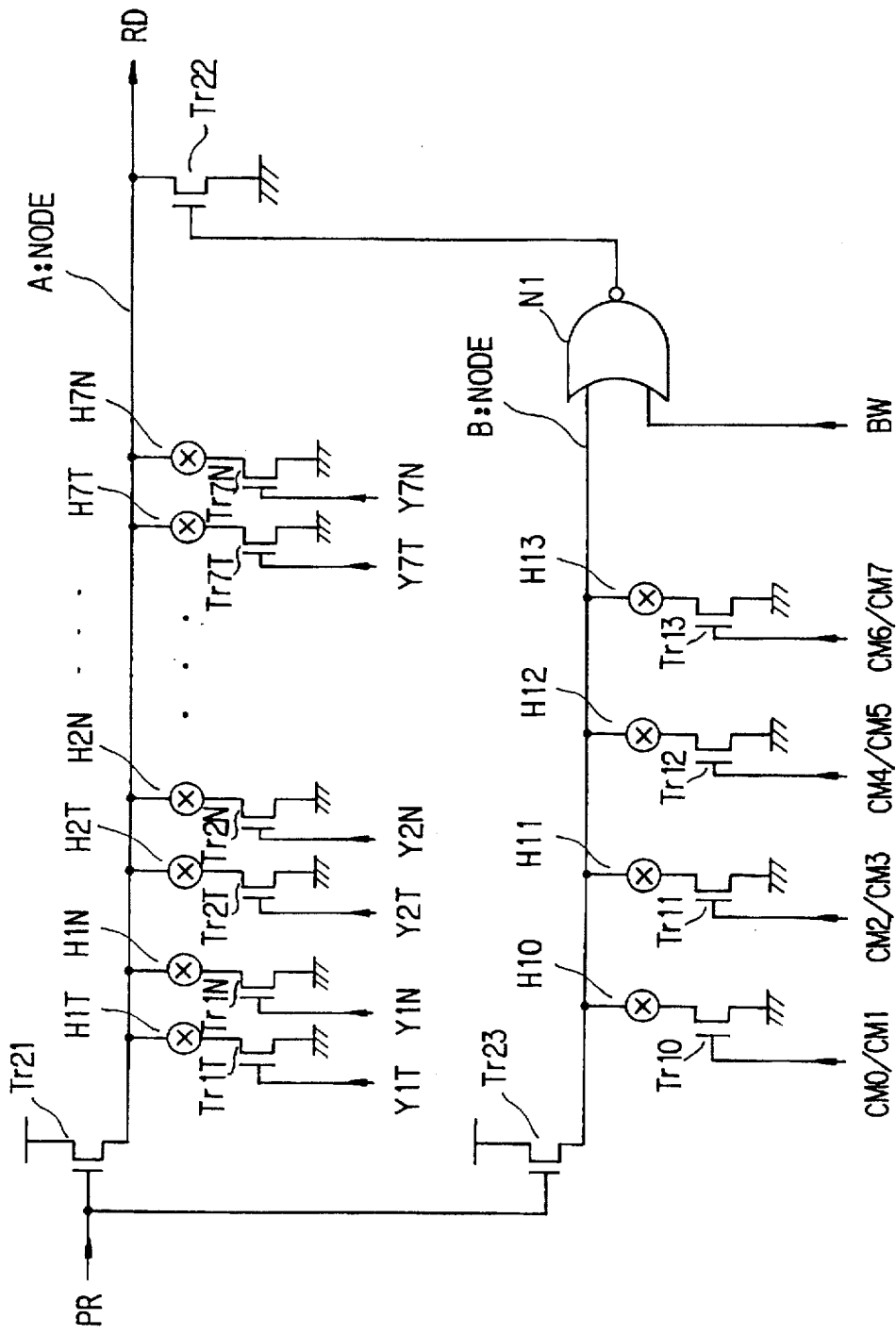
FIG. 2 is a circuit diagram illustrating a circuit configuration of each of the column redundancy discrimination circuits CRD1 to CRD4 of FIG. 1.
Figure 3:
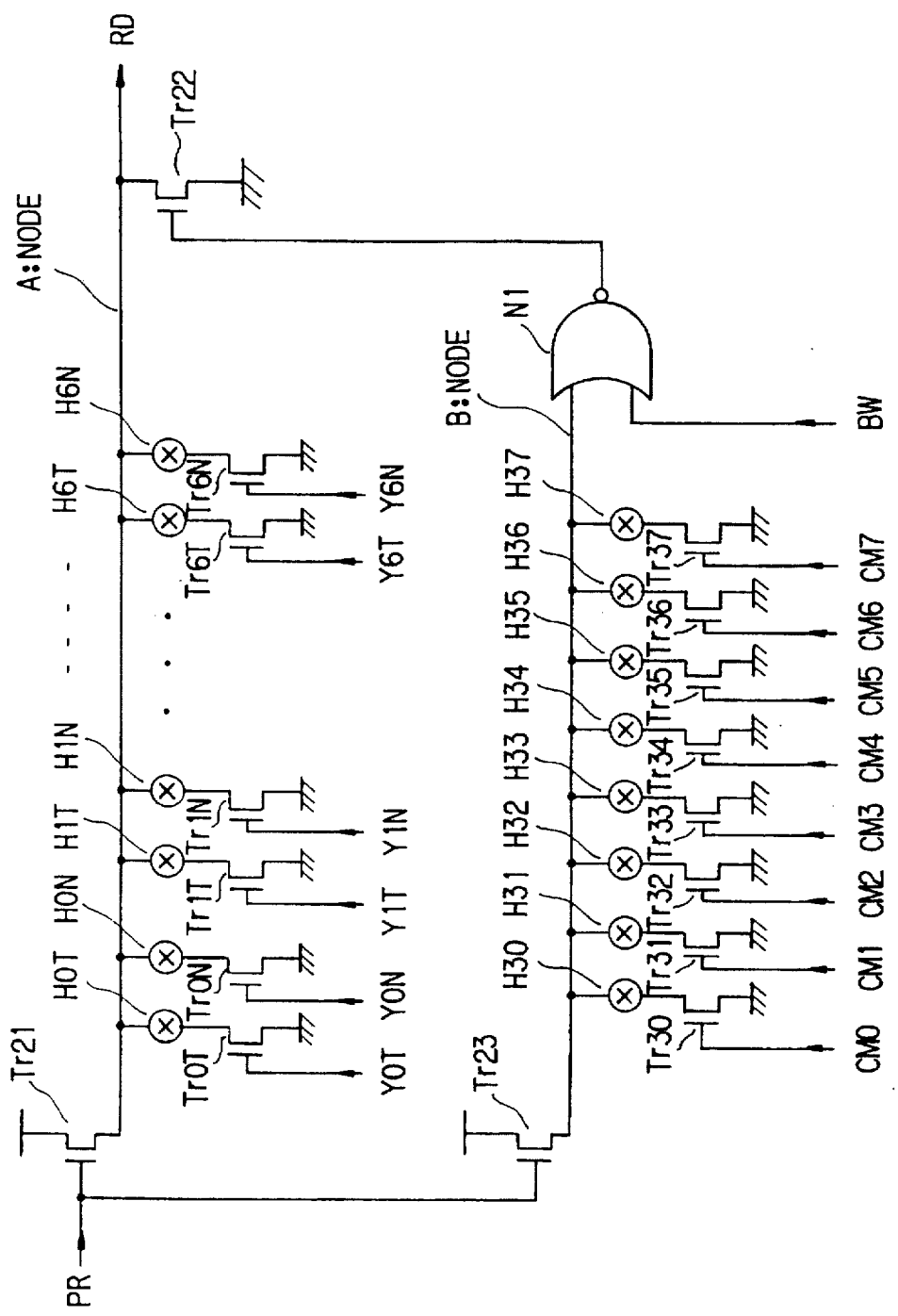
FIG. 3 is a circuit diagram illustrating an example of the column redundancy discrimination circuit of a prior art.

FIG. 2 is a circuit diagram illustrating a circuit configuration of each of the column redundancy discrimination circuits CRD1 to CRD4 of FIG. 1. FIG. 2 includes a normal redundancy discrimination circuit and a block write redundancy discrimination circuit.

The normal redundancy discrimination circuit comprises:

seven pairs of fuses H1T, H1N, to H7T, H7N, an end of each thereof connected to a node A for outputting a column redundancy discrimination signal RD, seven pairs of transfer gates Tr1T, Tr1N to Tr7T, Tr7N, each thereof connected between ground and the other end of a corresponding fuse of the seven pairs of fuses H1T, H1N to H7T; and H7N, a transfer gate Tr21, controlled by a pre-charge signal PR and provided between a power supply and the node A.

The block write redundancy discrimination circuit comprises:

four fuses H10 to H13, an end of each thereof connected to a node B;

four transfer gates Tr10 to Tr13, each thereof connected between ground and the other end of each of the four corresponding fuses H10 to H13;

a transfer gate Tr23, controlled by the pre-charge signal PR and provided between a power supply and the node B, a NOR gate N1 for outputting NOR logic of a block write control signal BW and logic of the node B; and a transfer gate Tr22 connected between the node A and ground; controlled by the output of the NOR gate N1.

As described above, each of the column decoders CD1 to CD4 selects one digit line according to the higher seven bits of the column address data in the normal write mode. So, when a defective digit line is found in the memory cell array, either one of each pair of the seven pairs of fuses H1T, H1N to H7T, H7N is cut according to the logic of the higher seven bits of the column address data corresponding to the defective digit line.

The gates of each pair of the seven pairs of transfer gates Tr1T, Tr1N to Tr7T, Tr7N are supplied with one of seven corresponding pairs of complementary column address signals Y1T, Y1N to Y7T, Y7N, each pair thereof representing logic and inverted logic of each of the higher corresponding seven bits Y1 to Y7 of the column address data. As a result, when the column address data designates the defective digit line, the node A remains at a logic HIGH for outputting the column redundancy discrimination signal RD at a logic HIGH, on condition that the block write control signal BW is at a logic HIGH in the normal write mode.

In the block write mode, eight sequential columns are selected by ignoring lower three bits of the column address data. In the embodiment of FIG. 1, four columns are selected by ignoring the second and the third lower bits Y1 and Y2 from each of the two memory cell arrays MCA1 and MCA2 and MCA3 or MCA4 selected according to the row address data.

So, one of the four fuses H10 to H13 is left uncut according to logic of the second and the third bits Y1 and Y2 of the defective column address, and the complementary column address signals Y1T, Y1N, Y2T and Y2N are suppressed in the block write mode.

The gates of the four transfer gates Tr10 to Tr13 are supplied with four column mask signals CM0, CM2, CM4 and CM6 for controlling digit lines corresponding to a column address having a LSB at logic '0' in the column redundancy discrimination circuits CRD1 and CRD3, and with four column mask signals CM1, CM3, CM5 and CM7 for controlling digit lines corresponding to column address having a LSB at logic '1' in the column redundancy discrimination circuits CRD2 and CRD4.

Therefore, only when the logic of the higher five bits Y3 to Y7 of the column address data coincides with that of the defective column address, which makes the node A at logic HIGH, and the column mask signals do not mask the defective digit line, which make the node B grounded and the transfer gate Tr22 OFF together with logic LOW of the block write control signal BW, is the redundancy discrimination signal RD at logic HIGH obtained for enabling the redundancy replacement, in one or both of the selected two memory arrays.

Thus, the block write redundancy discrimination of eight columns can be performed with only four fuses H10 to H13, half of those of the prior art, in addition to the fuses for the normal redundancy discrimination, in the column redundancy discrimination circuits CRD1 to CRD4 according to the embodiment.

The present invention has been described in connection with the semiconductor memory having a block write function of eight columns referring to FIGS. 1 and 2, wherein memory cells of the same raw address are divided into two memory cell arrays according to LSB of the column address data.

However, application of the invention is not limited to the described embodiment. For example, memory cells may be divided into two memory cell arrays according to logic of any of the lower three bits to be ignored of the column address data, or may be divided into four memory cell arrays according to logic of any two of the lower bits to be ignored of the column address data. In the latter case, the number of fuses for the block write redundancy discrimination in a column redundancy discrimination circuit becomes a quarter of the number of columns to be selected in one block write.

What is claimed is:

1. A semiconductor memory having a block write function wherein a block of memory cells, designated by a certain number of higher bits of column address data, can be written simultaneously by ignoring the other lower bits of the column address data, and wherein a data write into each block of memory cells can be masked individually by corresponding column mask signals, each corresponding to logic of the lower bits ignored, said semiconductor memory comprising:

at least two memory cell arrays driven by a common row decoder, wherein logic of at least one of the lower bits of the column address data is used to select all memory cells of one of every pair of said at least two memory cell arrays;

column decoders, one corresponding to each of said memory cell arrays, wherein one of said column decoders selects a memory cell corresponding to the column address data by decoding variable bits of the column address data other than said at least one of the lower bits in a normal write mode, and wherein each of said column decoders selects memory cells by decoding said certain numbers of higher bits of the column address data according to certain column mask signals corresponding to logic of the lower bits included in said variable bits, in a block write mode; and column redundancy discrimination circuits, one corresponding to each of said column decoders and controlling said corresponding column decoders in order to replace a data write operation into a memory cell connected to a defective digit line by a data write to a corresponding memory cell connected to a redundant digit line, by monitoring said variable bits in said normal write mode and by monitoring said certain number of higher bits and said certain column mask signals in said block write mode.

2. The semiconductor memory as claimed in claim 1, wherein:

said at least one of the lower bits is a least significant bit of the column address data;

said column redundancy discrimination circuits are a first column redundancy discrimination circuit and a second column redundancy circuit; and wherein said certain column mask signals are divided so that half of said column mask signals are in said first column redundancy discrimination circuit and the other half of said column mask signals are in said second column redundancy discrimination circuit.

3. The semiconductor memory as claimed in claim 2, wherein each of said column redundancy discrimination circuits comprises:

a first node for outputting a redundancy discrimination signal, said first node remaining at HIGH when the logic of said certain number of higher bits corresponds to said defective digit line in said block write mode;

a number of fuses equal to half of a number of said column mask signals, one end of each of said fuses connected to a pre-charged second node, one of said fuses, corresponding to said defective digit line, remaining uncut and the others of said fuses being cut;

transfer gates, each of said transfer gates grounding the other end of each of said fuses when turned ON by each of the corresponding half of said column mask signals;

a NOR gate for outputting NOR logic, where the NOR input signals comprise a block write control signal and logic of said second node; and a shunting transfer gate controlled by said NOR logic for grounding said first node.

* * * * *